(12) United States Patent
Randall et al.

(10) Patent No.: US 6,859,742 B2
(45) Date of Patent: Feb. 22, 2005

(54) REDUNDANT PRECISION TIME KEEPING FOR UTILITY METERS

(75) Inventors: Bruce Everett Randall, Rock Hill, SC (US); William Ian Jenrette, Raleigh, NC (US)

(73) Assignee: Landis+Gyr Inc., Lafayette, IN (US)

(*) Notice: Subject to any disclaimer, the term of this patent is extended or adjusted under 35 U.S.C. 154(b) by 0 days.

(21) Appl. No.: 09/904,444

(22) Filed: Jul. 12, 2001

(65) Prior Publication Data

US 2003/0036864 A1 Feb. 20, 2003

(51) Int. Cl.[7] .............................................. G01R 21/00
(52) U.S. Cl. .............................. 702/61; 324/74; 368/46
(58) Field of Search ........................ 340/870.02, 870.03, 340/563, 870.13, 870.14, 310.01, 310.02; 702/61, 62, 66, 64; 324/74, 130, 110; 370/314; 368/204, 46, 47

(56) References Cited

U.S. PATENT DOCUMENTS

| | | | |
|---|---|---|---|
| 4,106,007 A | * | 8/1978 | Johnston et al. ....... 340/310.01 |
| 4,114,141 A | | 9/1978 | Travis |
| 4,216,527 A | | 8/1980 | Emerson et al. |
| 4,218,737 A | | 8/1980 | Buscher et al. |
| 4,291,375 A | | 9/1981 | Wolf |
| 4,337,463 A | | 6/1982 | Vangen |
| 4,348,730 A | | 9/1982 | Emerson et al. |
| 4,400,783 A | | 8/1983 | Locke, Jr. et al. |
| 4,530,091 A | | 7/1985 | Crockett |
| 4,547,712 A | * | 10/1985 | Gotal et al. .................. 318/128 |
| 4,622,640 A | | 11/1986 | Shimamura et al. |
| 4,758,962 A | | 7/1988 | Fernandes |
| 4,777,381 A | | 10/1988 | Fernandes |
| 4,855,671 A | | 8/1989 | Fernandes |
| 4,902,964 A | * | 2/1990 | Szabela et al. .......... 324/103 P |
| 4,945,486 A | | 7/1990 | Nitschke et al. |
| 5,027,297 A | | 6/1991 | Garitty et al. |
| 5,301,122 A | | 4/1994 | Halpern |
| 5,325,048 A | | 6/1994 | Longini |
| 5,548,527 A | | 8/1996 | Hemminger et al. |
| 5,600,576 A | | 2/1997 | Broadwater et al. |
| 5,627,759 A | | 5/1997 | Bearden et al. |
| 5,680,324 A | | 10/1997 | Schweitzer, III et al. |
| 5,737,231 A | | 4/1998 | Pyle et al. |
| 5,737,730 A | | 4/1998 | Alvarenga et al. |

(List continued on next page.)

FOREIGN PATENT DOCUMENTS

| | | |
|---|---|---|
| EP | 90101411.8 | 1/1990 |
| GB | 9208755.0 | 4/1992 |

OTHER PUBLICATIONS

Model GPS–PCI, GPS Synchronized PCI Plug–In Card for Computer Clock Synchronization; (http://www.truetime-.com/DOCS/PDTS/blgps_pci.html, Copyright 1998 True Time Inc.).

Siemens Operator's Manual for type 4720 Power Meter (Copyright 1996 Siemens & Automation, Inc.).

Power Measurement brochure for Pegasys™/ION™ system (Rev 4/95, Imagecraft Limited, Printed in Canada).

Reliable Power Meters model 1650 PR Power Recorder data sheet (Reliable Power Meters, 1993).

"A Comprehensive Approach to Power Monitoring", by Michael Daish (Reliable Power Meters, 1993).

*Primary Examiner*—Donald E. McElheny, Jr.
*Assistant Examiner*—Paul L. Kim
(74) *Attorney, Agent, or Firm*—Maginot, Moore & Beck

(57) ABSTRACT

An apparatus for generating precision time signals includes a source of power line timing information, a source of precision time signals, and a timing circuit. The timing circuit is coupled to the source of precision time signals to receive a precision time signal there from, and is operable to generate clock information based on the precision time signal. The timing circuit is further operable to generate clock information based on the power line timing information.

20 Claims, 4 Drawing Sheets

U.S. PATENT DOCUMENTS

| | | | |
|---|---|---|---|
| RE35,793 E | 5/1998 | Halpern | |
| 5,796,631 A | 8/1998 | Iancu et al. | |
| 5,883,886 A * | 3/1999 | Eaton et al. | 370/314 |
| 5,995,911 A | 11/1999 | Hart | |
| 6,005,759 A | 12/1999 | Hart et al. | |
| 6,236,949 B1 * | 5/2001 | Hart | 702/64 |
| 6,298,014 B1 * | 10/2001 | Kihara et al. | 368/46 |
| 6,429,785 B1 * | 8/2002 | Griffin et al. | 340/870.02 |

* cited by examiner

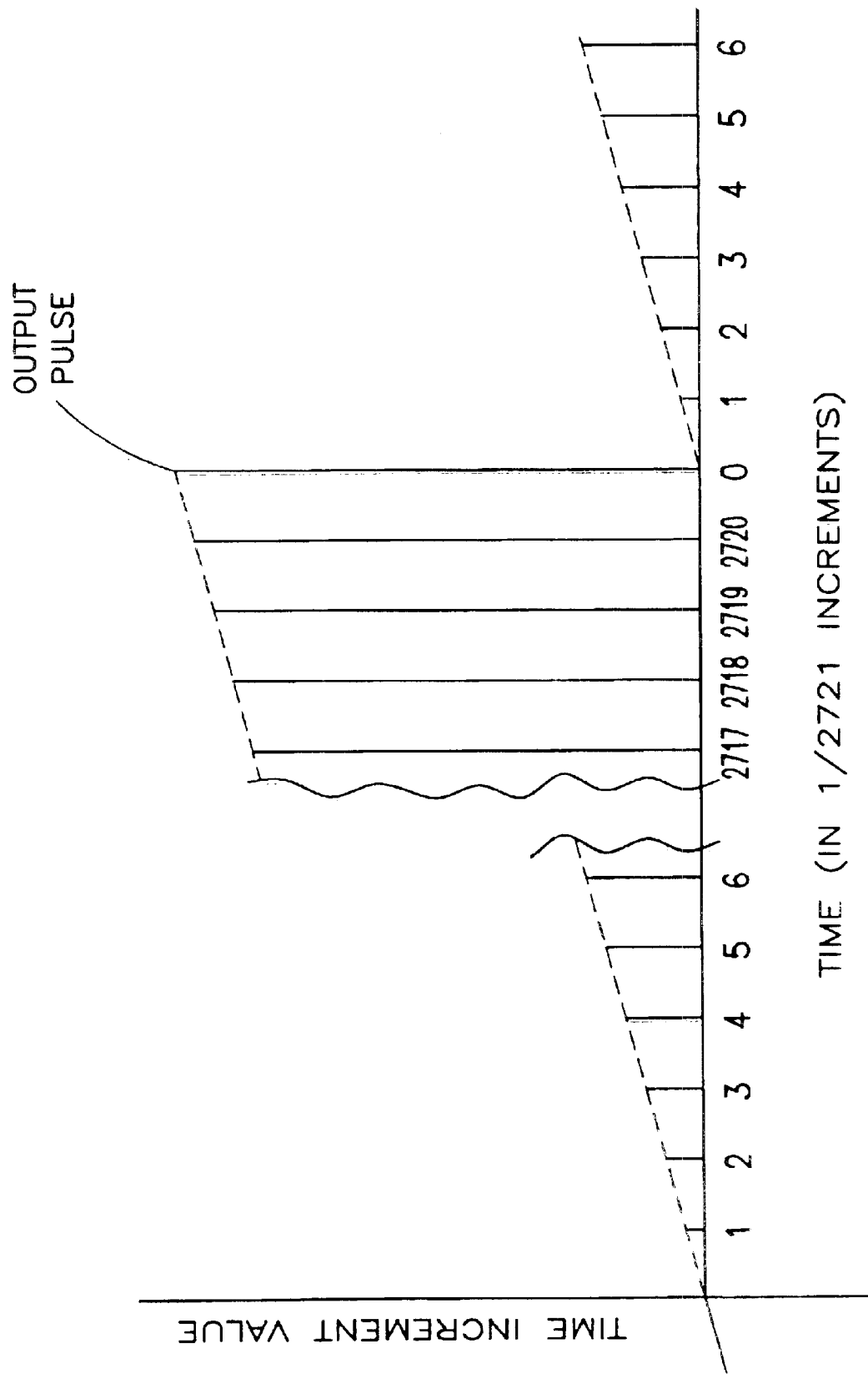

REDUNDANT PRECISION TIME KEEPING FOR UTILITY METERS

FIELD OF THE INVENTION

The present invention relates generally to utility meters, and more particularly, to utility meters that maintain a real-time clock.

BACKGROUND OF THE INVENTION

Utility meters are devices that, among other things, measure the consumption of a utility provided commodity, such as electric energy, gas, or water, by a residence, factory, commercial establishment or other such facility. Utility service providers employ utility meters to track individual customers' usage of utility provided commodities. Utilities track customer usage for many purposes, including billing and tracking demand for the relevant consumed commodity.

Increasingly, utility service providers prefer utility meters that employ electronic circuitry to perform measurement and communications operations. Electronic circuitry reduces the number of moving parts required to perform measurement operations, resulting in increased accuracy as well as higher reliability. Further, a utility meter is typically installed at or near the facility or residence of each customer. As a result, service providers historically needed field technicians or "meter-readers" to obtain data from the remotely located utility meters. Such manual meter reading imposes significant labor costs and is vulnerable to transportation problems and human error. Electronic circuitry also addresses this problem by allowing utility meters to communicate metering data and other information (such as, for example, various diagnostic data) to remote, central facilities, whereby large numbers of utility meters may be read remotely without human meter-readers.

It has become increasingly desirable to employ accurate real-time clocks in utility meters having electronic circuitry. For example, some meters store time correlated data for the purposes of charging customers different rates depending on the times of day when particular amounts of electricity are consumed. Such metering operations are typically referred to as "time of use" metering. Time of use metering requires a highly accurate clock to ensure accurate billing.

Another type of metering that is sensitive to clock accuracy is demand metering. In demand metering, a customer may be charged based on the customer's highest usage rate over any demand period within a billing cycle. A demand period is a finite time period, such as 15 minutes or an hour. An inaccurate clock can substantially degrade demand meter data, thereby resulting in significant overcharging or undercharging.

While demand metering and time-of-use metering benefit to some degree from the use of an accurate real time clock as described above, the type of metering that may have the most need for accurate time-keeping is power quality metering. Power quality metering is a type of metering in which power quality data, for example, waveform data, may be recorded from time to time for analysis. Power quality data may include data generated at or around the time that a power quality event, i.e., a power surge or power sag, occurs. Power quality data may be used by utilities and consumers to, among other things, identify the cause and/or effect of a power surge or a power sag.

In particular, one example of a power quality meter is disclosed by U.S. Pat. No. 5,627,759 to Bearden et al. (hereinafter the "Bearden patent"), which is assigned to the assignee of the present invention and incorporated herein by reference. The Bearden patent describes a revenue meter that is also operable to, among other things, detect power quality events, such as a power surge or sag, and then report the detection of the power quality event to a utility or supplier.

One of the useful features of the meter disclosed in the Bearden patent is waveform capture. The meter disclosed in Bearden patent is operable to obtain waveform information regarding the voltage and/or current waveform at about the time a power quality event is detected. Such a feature is advantageous because the captured waveform may be analyzed to help determine potential causes of the event, the severity of the event, or other pertinent data.

One use of waveform capture feature is to analyze the waveforms from several meters on an electrical network after a power quality event in order to evaluate the propagation of the fault through the network. For example, if a power surge occurs over a portion of the power distribution system, then the utility may obtain captured waveforms from various meters on that portion of the network. The utility may then obtain information on how the power surge propagated through the network, as well as other information, by comparing the waveforms captured by the various meters.

One difficulty of performing analysis on the captured waveforms of several meters is temporally aligning the captured waveforms. In particular, to benefit from comparing the waveforms from several meters after a power quality event, it is important to temporally align or synchronize the captured waveforms. However, commonly used electronic clocks in electronic meters are not highly synchronized to each other, or in fact, to any external equipment.

In the past, clock circuits within revenue meters have been calibrated periodically using the line voltage signal, which oscillates at 60 Hz. While such a practice increases the accuracy of the meter clock circuits, the 60 Hz signal is not always dependable, and indeed may become unavailable during a power sag or power outage. Such a drawback is particularly problematic because power quality meters require accurate timing precisely for those times when the power line signal becomes unavailable.

U.S. Pat. No. 5,995,911 teaches the use of a GPS signal to synchronize the internal clock of a power sensor device. The drawback of relying on a GPS signal is that the GPS signal is not always available in real conditions.

What is needed, therefore, is an arrangement for keeping accurate time within a revenue meter that has increased reliability over the prior art designs described above.

SUMMARY OF THE INVENTION

The present invention fulfills the above need, as well as others, by employing a clock circuit that generates clock signals based on a precision time signal and timing information derived from power line signals. Because both systems are employed, highly accurate clock information is available in the meter in the event that either of the sources of timing information becomes unavailable.

A first embodiment of the present invention includes an apparatus for generating precision clock information, comprising a source of power line timing information, a source of externally-generated precision time information, and a timing circuit. The timing circuit is coupled to the source of externally-generated precision time information to receive a precision time information therefrom, and is operable to generate clock information based on the precision time signal. The timing circuit is further operable to generate clock information based on the power line timing information.

Preferably, the power line timing information is synchronized to the precision time signal within the meter to ensure a smooth transition from relying on the precision time signal to relaying on the power line timing information.

Another embodiment of the present invention is a meter that obtains energy consumption data and stores energy consumption data in a memory associated with a time record. The meter includes a source of power line timing information, a source of externally-generated precision time information, and a timing circuit. The timing circuit is coupled to the source of externally-generated precision time information to receive a precision time signal therefrom, and is operable to generate clock information based on the precision time signal. The timing circuit is further operable to generate clock information based on the power line timing information. The time record is based on the clock information.

Accordingly, the above described meter thus stores energy consumption data associated with a time record, wherein the time record is generated using redundant sources of timing information that are generated external to the meter and therefore are standardized. Such data may then be compared to other stored energy consumption data and time records of similar meters to obtain an accurate picture of certain behaviors of an electrical system. Without standardized clocking, minor variances in time-keeping can render comparative data from different meters largely meaningless.

The above described features and advantages, as well as others, will become more readily apparent to those of ordinary skill in the art by reference to the following detailed description and accompanying drawings.

BRIEF DESCRIPTION OF THE DRAWINGS

FIG. 2A shows a graph of a time increment value versus time for the timing arrangement of FIG. 2.

DETAILED DESCRIPTION

Figure 1:
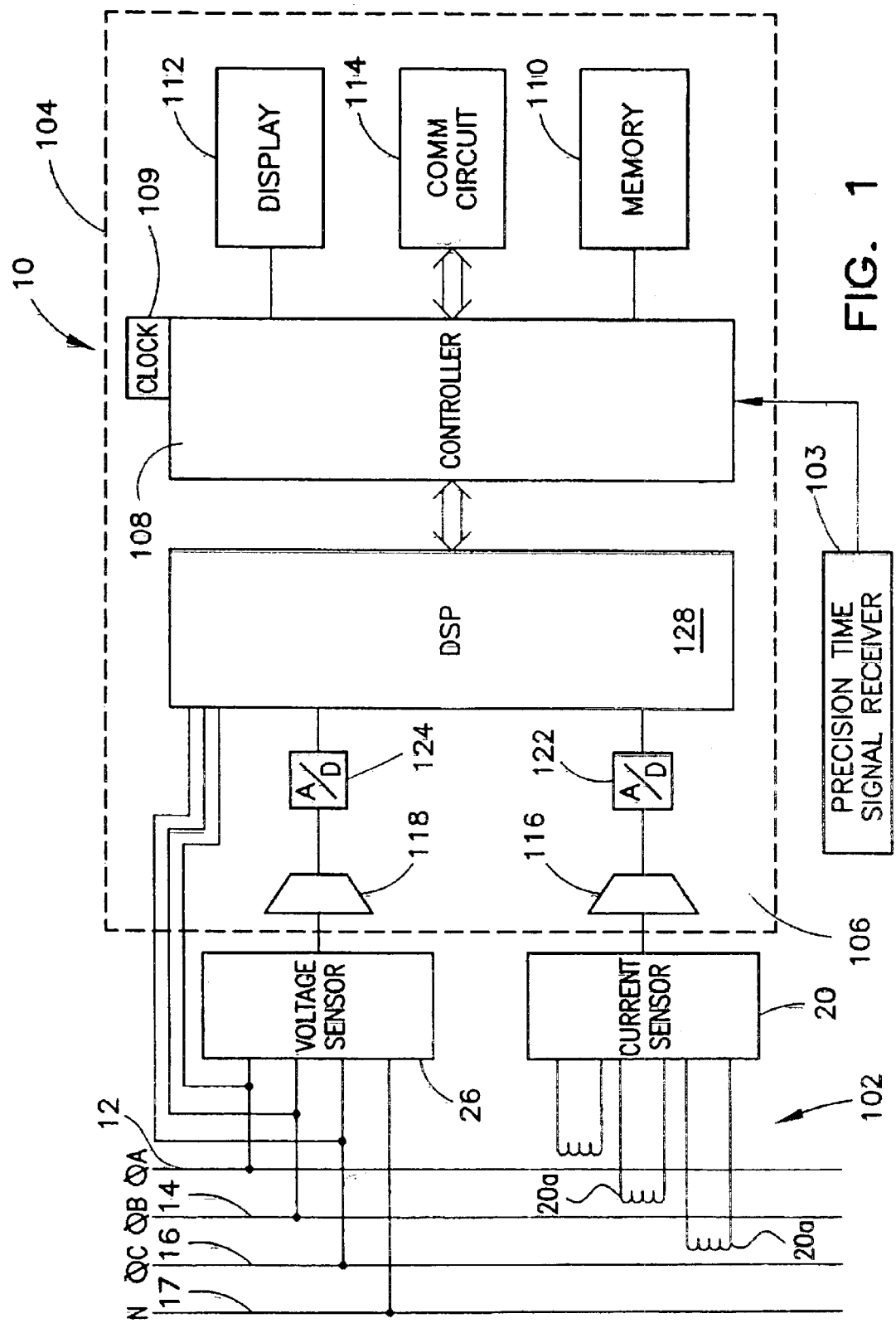
FIG. 1 shows a block diagram of an exemplary electricity meter according to the present invention.

FIG. 1 shows a block diagram of an exemplary electricity meter 10 according to the present invention. The meter 10 is shown in FIG. 1 configured to measure power consumed over a three phase power system that includes power line A 12, power line B 14, and power line C 16. The three phase power system further includes a neutral line N 17. The three phase power system delivers power from a source, not shown, to a load not shown, through the power lines 12, 14, 16 and 17. It will be appreciated, however, that the present invention may be readily adapted to other types of electrical systems.

The electricity meter 10 essentially comprises sensor circuitry 102 and a measurement circuit 104. The sensor circuitry 102 includes a polyphase current sensor 20 and a polyphase voltage sensor 26. The measurement circuit 104 further comprises a conversion circuit 106, a controller 108, a memory 110, a display 112, and a communication circuit 114.

The current sensor 20 is connected to receive a signal indicative of the current waveform flowing through the phase A power line 12, the phase B power line 14 and the phase C power line 16. To this end, the current sensor 20 may include current transformers 20a that are in a current sensing relationship with the power lines 12, 14, and 16. The current sensor 20 is further connected to the measurement circuit 104 through a first multiplexer 116. It will be appreciated that while the current sensor circuit 20 is shown to include current transformers 20a, the current sensor circuit 20 could alternatively comprise any other device known in the art that detects current on the power lines 12, 14 and 16 and produces a signal indicative of the detected current waveform. The first multiplexer 116 is a part of the conversion circuit 106, discussed further below.

Referring to the polyphase voltage sensor 26, the voltage sensor 26 is typically connected directly to the phase A power line 12, the phase B power line 14, and the phase C power line 16 to obtain a voltage measurement therefrom. To this end, the voltage sensor 26 may suitably include a high resistance voltage divider, not shown, for each of the three phase power lines 12, 14 and 16. The voltage sensor 26 is further connected to the measurement circuit 104 through a second multiplexer 118. Like the first multiplexer 116, the second multiplexer 118 is a part of the conversion circuit 106 and is discussed further below.

The conversion circuit 106 is a circuit operable to receive polyphase voltage and polyphase current measurement signals and generate digital signals therefrom, the digital signals including a power consumption signal and voltage and current signals. In the exemplary embodiment described herein, the conversion circuit 106 comprises first and second 116 and 118, respectively, first and second analog to digital converters ("A/Ds") 122 and 124, respectively, and a digital signal processor 128. The above listed components of the conversion circuit 106 may suitably be incorporated onto a single semiconductor substrate. Such devices are well known and could include the Power Measurement Integrated Circuit found in a model S4 electrical utility meters available from Siemens Power Transmission and Distribution, Inc.

The controller 108 is operably configured to, and executes programming instructions to, receive the digital signals from the conversion circuit 106, monitor and record power consumption using the digital signals, and analyze the digital voltage measurement signals to determine whether one or more measurement errors is present. The controller 108 may suitably be a K0 series microcontroller available from NEC. However, the controller 108 may alternatively comprise any other suitable processing device or circuit. The controller 108 generally includes firmware, or in other words, an integrated memory into which programming instructions are stored. Alternatively, the programming instructions may be stored in the nonvolatile memory 110.

In accordance with the present invention, the controller 108 further performs one or more operations that require a real-time clock. Such real-time operations may include load profiling, demand metering, time-of-use metering, power quality operations, or any combination of the above.

In a preferred embodiment, the controller 108 and the DSP 128 cooperate to perform power quality operations as taught by the Bearden Patent discussed above, as well as U.S. patent application Ser. No. 09/227,434 and U.S. patent application Ser. No. 09/226,957, both filed Jan. 8, 1999, which are incorporated herein by reference. To this end, the DSP 128 is operable to detect a power quality event, such as a voltage surge or a voltage sag on any of the power lines 12, 14, or 16, and, in conjunction with the controller 108, record and store a waveform associated with the event. The controller 108 is further operable to generate a time-stamp associated with the event.

Furthermore, the measurement circuit 104 includes a timing circuit that employs redundant precision timekeeping in accordance with the present invention. The timing circuit in the exemplary embodiment of FIG. 1 is largely embodied within the DSP 128. Regardless of implementation, however, the timing circuit is coupled to the source of precision time signals to receive a precision time signal therefrom and is operable to generate clock information based on the precision time signal. As described herein, a precision time signal is a signal that contains precision, standardized timing information. The timing circuit is further operable to generate clock information based on power line timing information. As described herein, power line timing information is timing information derived from the cyclical, steady state frequency of power line signals.

To this end, power line timing information is typically obtained from the digital voltage measurement signal generated by the voltage sensor circuit 26, the multiplexer 118 and the A/D 124 as discussed further below. In addition, the source of precision timing signals in the exemplary embodiment described herein includes a receiver 103 that is operable to obtain precision timing information from an external source via radio frequency ("RF") signals. For example, the receiver 103 may be a global positioning satellite ("GPS") signal receiver that is operable to obtain precision timing information from a GPS transmission. In another example, the receiver 103 may be configured to receive IRIG-A type timing signals. Other types of externally-generated time information may be used as well. In any event, the receiver 103 is coupled to the controller 108 to provide the received timing information thereto. The controller 108 is operable to generate the precision time signals from the received information and provide the signals to the DSP 128.

In operation, the current sensor circuit 20 detects the phase A current, the phase B current, and the phase C current, and generate current measurement signals therefrom. The current sensor circuit 20 may suitably generate the three phase measurement signals contemporaneously and continuously. The current sensor circuit 20 provides the phase A, phase B and phase C measurement signals to the first multiplexer 116. The current measurement signals typically have a voltage level that is indicative of the instantaneous current level on their respective phases. For current transformers 20*a* designed for utility meter use, the current measurement signals measure from approximately 0.0 volts to 0.3 volts maximum. Other scaling factors may of course be employed.

The first multiplexer 116, under the control of the controller 108, then provides the instantaneous current measurement signal from one of the phase A, phase B, or phase C current measurement signals to the first A/D converter 122. The first multiplexer 116 typically provides each phase in rapid succession of cycles, such that each phase is provided to the first A/D converter 122 every third cycle. According to the exemplary embodiment described herein, the first multiplexer 116 provides the current measurement signals to the first A/D converter 122 at a rate of 2721 Hz.

The first A/D converter 122 receives and samples or digitizes the rapid succession of instantaneous current measurement signals. The first A/D converter 122 then provides to the DSP 128 a stream of digital words, each representing the magnitude of one of the three phase currents at a particular instant.

Contemporaneously, the voltage sensor circuit 26 detects the phase A voltage, the phase B voltage, and the phase C voltage, and generates voltage measurement signals therefrom. The voltage sensor circuit 26 provides the phase A voltage measurement signal, the phase B voltage measurement signal, and the phase C voltage measurement signal to the second multiplexer 118. Each voltage measurement signal is typically a signal having a voltage level that is indicative of the instantaneous voltage level on its respective phase. In the exemplary embodiment described herein, the voltage sensors are configured to provide voltage measurement signals that range from approximately 0.0 volts to 0.3 volts maximum. Other scaling factors may of course be employed.

The second multiplexer 118 then provides each phase voltage measurement signal in a rapid succession of sequences, such that each phase voltage is provided to the second A/D converter 124 every third step of the sequence. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter wiring configuration, the first multiplexer 116 provides the phase x current measurement signal and the second multiplexer 118 provides the phase x voltage measurement signal contemporaneously, where x rotates among A, B and C.

The second A/D converter 124 receives and samples or digitizes the rapid succession of instantaneous voltage measurement signals. The second A/D converter 124 thus provides to the DSP 128 a stream of digital words or samples, each representing the magnitude of one of the three phase voltage measurement signals at a particular instant. The first A/D converter 122 and the second A/D converter 124 thus provide the digital voltage and current measurement signals in a predetermined synchronous phase relationship. The DSP 128 within the conversion circuit 106 the determines power consumption by selectively multiplying the digital voltage measurement signal samples and the digital current measurement signal samples received from the A/D converters 122 and 124, and then adding them together.

In particular, in a four wire wye meter wiring configuration, the appropriate power calculation is:

$$\text{POWER} = V_A I_A + V_B I_B + V_C I_C \tag{1}$$

The DSP 128 carries out the above calculation in the manner described herebelow. The DSP 128 receives from the A/D converters 122 and 124 a digital current measurement signal sample and a voltage measurement signal sample. The DSP 128 multiplies the received samples, and the resulting product is added to a running total or sum. The DSP 128 then receives the next set of digital current and voltage measurement signal samples and repeats the process. In other words, if $\text{DIG\_VOLT}_x$ is digital voltage measurement signal for a phase x and $\text{DIG\_CURR}_x$ is the digital current measurement signal for the phase x, then the DSP 128 carries out the following calculation:

$$\text{POWER} = \text{SUM}(\text{DIG\_VOLT}_x * \text{DIG\_CURR}_x) \text{ for } x=\{A,B,C,A,B,\ldots\} \tag{2}$$

From time to time, the DSP provides power consumption data derived from POWER to the controller 108.

The controller 108 accumulates the power consumption data until a predefined watt-hour threshold has been reached. At that point, the controller 108 generates a power consumption pulse and increments a power consumption counter. The power consumption counter is the number by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The controller 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the case of a power interruption.

Optionally, the controller 108 further provides the power consumption counter information, as well as other information, to the communication circuit 114. The communication circuit 114 may then communicate the information over an external communication means, such as a public telephone network, to a central processing facility for the utility. In this manner, the utility may track and bill for power consumption registered by the meter 10 without requiring an employee to physically view the meter.

The controller 108 also generally controls the operation of the conversion circuit 106, and particularly, the first and second multiplexers 116 and 118, respectively, the first and second A/D converters 122 and 124, respectively, and the digital signal processor 128. The controller 108 also maintains a real-time clock as well as a system clock 109. The real-time clock is generally carried out in software or firmware. The real-time clock maintains the date and time based on clock information generated by the DSP 128, discussed below. The system clock 109 is a circuit, which typically includes a crystal oscillator and may involve operations of the controller 108, that generates the relatively high frequency system clocking information for the operation of the digital circuits. For example, the multiplexers 116, 118, the A/D converters 122, 124, the DSP 128, and the controller 108 all operate using clocking information. The system clock 109 typically generates a nominal clock frequency and various fractions thereof for use by different circuits. System clocks are well known in the art.

In addition to metering energy consumption, the DSP 128 also determines and provides other information to the controller 108. In particular, the DSP 128 provides for each phase, the measured voltage magnitude and phase angle data, and the measured current magnitude and phase angle data. The DSP 128 also provides captured waveforms to the controller 108 in the event of a power quality events. Moreover, the DSP 128 provides clock information with which the controller 108 may maintain a real-time clock.

To determine the measured voltage and current magnitude data, the DSP 128 performs an RMS calculation on each digital voltage and current measurement signal. This calculation may for example, include, for each phase voltage and current, squaring each sample of the digital measurement signal, and taking the mean of the squared samples over time.

To determine phase angles for each voltage, the DSP 128 uses the time differences between the zero crossings of the phase voltage signals. The time difference between the zero crossing of a particular signal $V_x$ and the $V_A$ signal, plus the direction of the respective zero crossings, provides the phase information. Current phase information is determined using watts per phase and VAR per phase. In particular, a current phase angle for phase x is given by arctan ($VAR_x$/$WATTS_x$).

The DSP 128 provides the measured voltage and current magnitude and phase angle data to the controller 108. Table 1, below shows the measured values so provided.

TABLE 1

$VRMS_A$ = Phase A voltage magnitude
$VRMS_B$ = Phase B voltage magnitude
$VRMS_C$ = Phase C voltage magnitude
$IRMS_A$ = Phase A current magnitude
$IRMS_B$ = Phase B current magnitude
$IRMS_C$ = Phase C current magnitude
$V<_A$ = Phase A voltage phase angle
$V<_B$ = Phase B voltage phase angle
$V<_C$ = Phase C voltage phase angle
$I<_A$ = Phase A current phase angle
$I<_B$ = Phase B current phase angle
$I<_C$ = Phase C current phase angle It is noted that the controller 108 may be required to perform some further conversion on the measured data to put it in the form identified in Table 1.

To provide waveform capture data, the DSP 128 preferably includes a buffer or the like that records the instantaneous current and voltage information received from the A/D converters 122 and 124. The buffer is a circular FIFO buffer that only retains a few cycles of data. Under normal operation, however, the waveform capture data in the buffer of the DSP 128 is continuously replaced with new data.

In the event that a power quality event is detected, i.e. by the DSP 128 detecting voltage signals that are either too high or too low, the DSP 128 retains the relevant waveform information in the buffer and provides it to the controller 108. The controller 108 then records the relevant captured waveform in the memory 110 along with a precision time stamp generated in accordance with the present invention. Further detail regarding a suitable DSP arrangement for detecting power quality events, storing waveform data continuously in a buffer, and recording the waveform data when a power quality event is detected is described in U.S. patent application Ser. No. 09/226,957.

In any event, the memory 110 contains waveform data record of recent power quality events stored in records. Each record includes a precision time stamp, which allows for the subsequent comparison to waveforms captured in other meters during the same power quality event. Because several meters preferably all have precision time stamps generated in accordance with the present invention, the propagation of the power quality event through an electrical system may be studied. Other non-waveform data may also be captured and time stamped.

Figure 2:
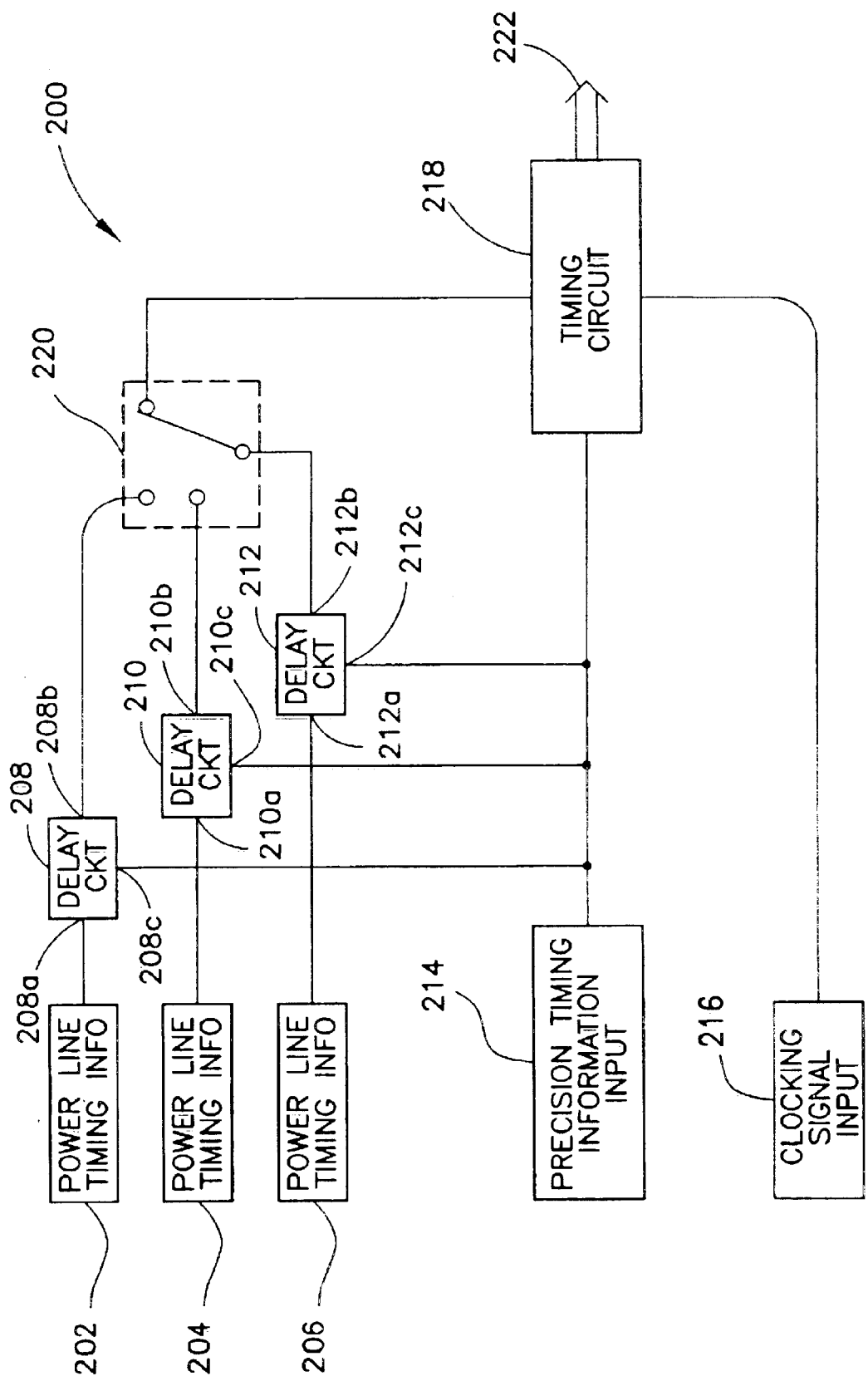
FIG. 2 shows a block diagram of a timing arrangement according to the present invention.

The precision time stamp is obtained using a timing arrangement according to the present invention. FIG. 2 shows an exemplary timing arrangement 200 according to the present invention. In general, the timing arrangement 200 generates precision clock information that may be used by real-time calendar/clock software, not shown in FIG. 2, to track the passage of time. Appropriate hardware and software elements for maintaining a calendar/clock using the timing information generated by the arrangement 200 would be known to those of ordinary skill in the art. The timing arrangement 200 may suitably be carried out in the DSP 128 of the meter 10 of FIG. 1. However, it will be appreciated that other processors, digital circuits, or combinations thereof may carry out the invention in the meter 10 of FIG. 1 or in other revenue meters.

The timing arrangement 200 includes a first power line timing information input 202, a second power line timing information input 204, a third power line timing information input 206, a first delay 208, a second delay 210, a third delay 212, a precision timing information input 214, a clocking signal input 216, and a timing circuit 218.

The first power line timing information input 202 is a first source of power line timing information. To this end, the first power line timing information input 202 is operable connected to receive phase A digital voltage measurement signals. In the embodiment of FIG. 1, the phase A digital voltage measurement signals are received from the A/D converter 124. In any event, the first power line timing information input 202 preferably is able to convert the timing information into a pulse signal that is derived from the power line. By way of example, the first power line timing information input 202 may suitably include a circuit that generates a pulse every time the phase A digital voltage measurement signal crosses zero. (See FIG. 3, discussed below).

Similarly, the second power line timing information input 204 is a second source of power line timing information. To this end, the second power line timing information input 204 is operable connected to receive phase B digital voltage measurement signals. In the embodiment of FIG. 1, the phase B digital voltage measurement signals, similar to the phase A digital voltage measurement signals, are received from the A/D converter 124. In any event, the second power line timing information input 202 preferably is able to convert the timing information into a pulse signal that is derived from the phase B power line.

In an analogous manner, the third power line timing information input 206 is a third source of power line timing information that is generated from the phase C power line. Thus, in the exemplary embodiment described herein, the power line timing information is derived from the same voltage measurement data that is used to carry out the various energy calculations described above in connection with FIG. 1.

The precision timing information input 214 is a source of precision timing information. To this end, the precision timing information input 214 is preferably coupled to receive precision timing information derived from an external precision time clock signal, such as one generated by a GPS transmitter or IRIG-A transmitter. In the exemplary embodiment of FIG. 1, the precision timing information input 214 is operably coupled to a precision timing information receiver 103 through the controller 108. The precision timing information input 214 is operably connected to provide the precision timing information to the timing circuit 218 and to each of the delay circuits 208, 210, and 212.

The delay circuit 208 includes an input 208a, an output 208b, and a control input 208c. The input 208a is coupled to the first power line timing information input 202 and the output 208b is coupled to the timing circuit 218 through a selector switch 220. The control input 208c is operably coupled to receive the precision timing information from the precision timing information input 214. The delay circuit 208 is operable to provide a controlled amount of delay between its input 208a and its output 208b. The amount of delay is controlled such that the output signal is synchronized with the precision time signal provided to its control input 208c. By synchronized, it is meant that the timing information generated at the output 208b is substantially phase-aligned with the precision timing information provided at the control input 208c.

Figure 3:
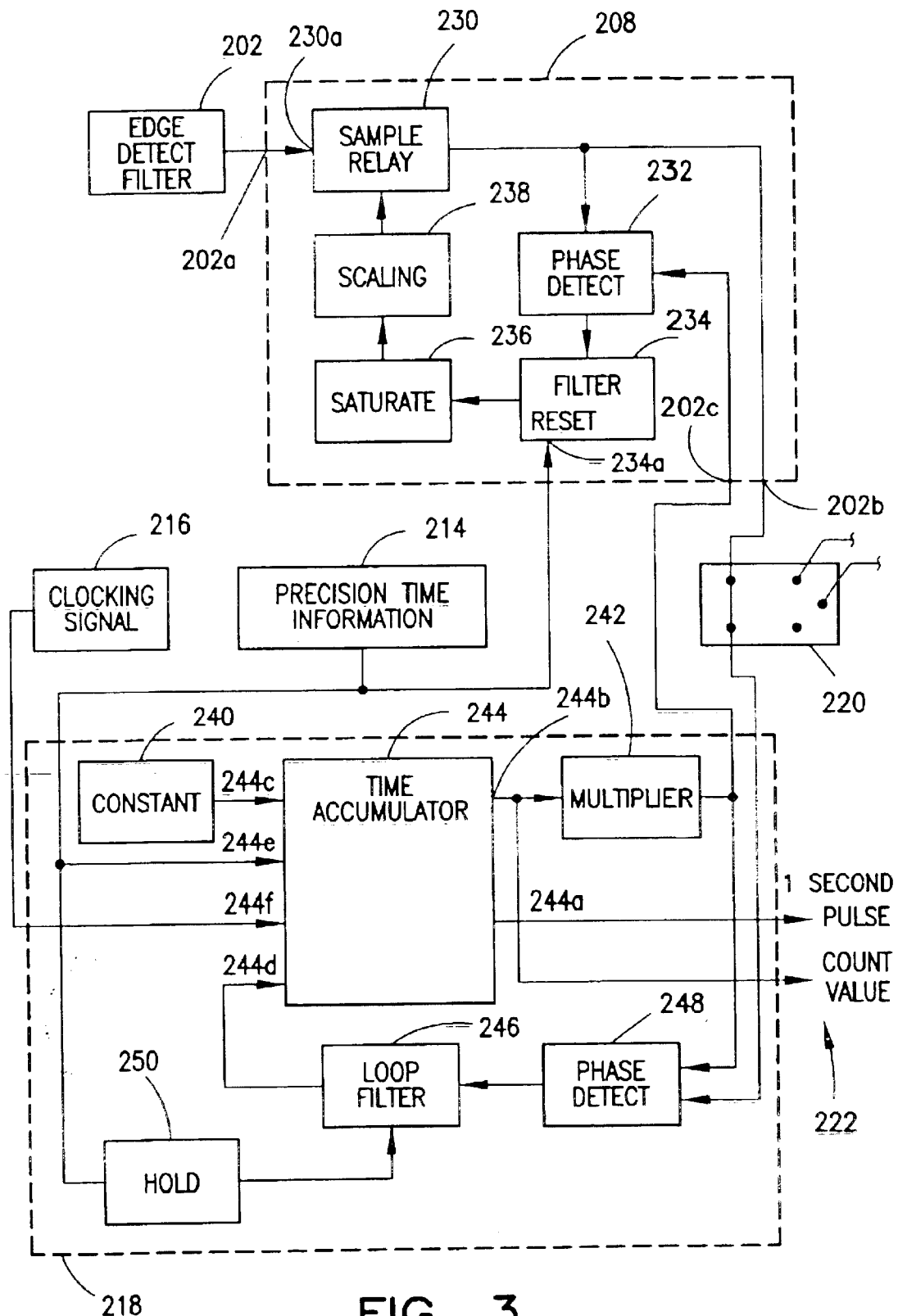
FIG. 3 shows in further detail portions of the timing arrangement of FIG. 2.

An exemplary embodiment of such a delay circuit is discussed below in connection with FIG. 3. It will be noted, however, that in the embodiment of FIG. 3, the delay 208 receives the precision timing information after it has been processed by the timing circuit 218. While the embodiment of FIG. 3 shows a preferred embodiment, those of ordinary skill in the art may readily implement a delay circuit that employs the precision timing information received directly from the input 214 as shown in FIG. 2.

Similarly, the delay circuit 210 includes an input 210a, an output 210b, and a control input 210c. The input 210a is coupled to the second power line timing information input 204 and the output 210b is coupled to the timing circuit 218 through the selector switch 220. The control input 210c is operably coupled to receive the precision timing information from the precision timing information input 214. As with the delay circuit 208, the delay circuit 210 is operable to provide a controlled amount of delay between its input 210a and its output 210b. The amount of delay is controlled such that the output signal is synchronized with the precision time signal provided to its control input 210c.

Likewise, the delay circuit 212 includes an input 212a, an output 212b, and a control input 212c. The input 212a is coupled to the third power line timing information input 206 and the output 212b is coupled to the timing circuit 218 through the selector switch 220. The control input 212c is operably coupled to receive the precision timing information from the precision timing information input 214. As with the delay circuit 208, the delay circuit 212 is operable to provide a controlled amount of delay between its input 212a and its output 212b. The amount of delay is controlled such that the output signal is also synchronized with the precision time signal provided to its control input 210c.

Accordingly, each of the delay circuits 208, 210, and 212 provide delayed power line timing information derived from one of the phase power line signals. Each of the delay circuits 208, 210 and 212 provide the timing information such that it is synchronized to the precision timing information. It will be appreciated that the fact that the power line timing information is synchronized to the precision timing information does not require that the power line timing information be the same signal as the precision timing information. For example, in the exemplary embodiment described herein, the power line timing information constitutes a 60 Hz pulse signal while the precision timing information constitutes a 1 Hz pulse signal. Because they are synchronized, however, one out of every sixty pulses of each power line timing information signal is aligned with each pulse of the precision timing information signal.

The selector switch 220 is configured to provide only one of the three power line timing information signals to the timing circuit 218. In particular, the timing circuit 218 only uses one power line timing information signal. The selector switch 220, however, allows for triple redundancy in a three phase power system. In particular, if the phase A power line signal becomes unavailable, and as a result, the first power line timing information input 202 cannot generate timing information, then the selector switch 220 is configured to couple the second delay circuit 210 to the timing circuit 218. Accordingly, as long as one of the three phase power lines is operational, the timing circuit 218 will receive power line timing information via the selector switch 220.

In a preferred embodiment, the selector switch 220 is configured to default to obtaining power line timing information from the phase C power line through the delay circuit 212. If the phase C power line signal is unavailable, then the selector switch 220 switches to receive the phase A power line signal via the delay circuit 208. If the phase A power line signal is unavailable, then the selector switch 220 switches to receive the phase B power line signal via the delay circuit 210.

The clocking signal input 216 is operable to provide a clocking signal from the system clock. The clocking signal is typically at a much higher frequency than the power line timing information or the precision timing information. The clocking signal input 216 is operable to provide the clocking signal to the timing circuit 218. The clocking signal is also used to clock the operation of the various digital elements in the timing arrangement 200. In a preferred embodiment, the clocking signal is the same signal as the signal that is used to clock the A/D converter that generates the digital power line signals. Thus, for example, in the embodiment of FIG. 1, the clocking signal is the 2721 Hz clock signal used by the A/D converter 124.

The timing circuit 218 is a circuit operable to generate clock information based on the power line timing information received through the selector switch 220. The timing circuit 218 is further operable to generate clock information based on the precision time information received from the precision time information input 214. In accordance with the present invention, the timing circuit 218 may also generate clock information when the precision time information becomes unavailable by using the power line timing information. Likewise, the timing circuit 218 may generate clock information when the power line timing information becomes unavailable by using the precision timing information.

In operation, the timing circuit 218 receives the precision time information. During normal operation, the timing circuit 218 generates clock information in the form of an output pulse and provides the output pulse at its output 222. The clock information may be employed by a real-time clock circuit connected to the output 222 to maintain a precision calendar/clock. As discussed above, the real time clock may be maintained as a software routine performed by the controller 108 of FIG. 1. The clock information pulses are synchronized to the precision time information.

The timing circuit 218 also receives the system clocking signal and employs the clocking signal to maintain fractional time information between the output pulses. In particular, while the clock information pulses represent relatively large increments of time, the clocking information represents fractions of such increments. For example, an output pulse may be generated every second. In such a case, the timing circuit 218 maintains a time increment value between adjacent seconds. In the exemplary embodiment described herein, the clocking signal has a pulse frequency of approximately 2721 Hz.

Thus, the timing circuit 218 maintains a time increment value corresponding to approximately $1/2721$ second increments. FIG. 2A shows a timing graph of the time increment value versus time. As shown in FIG. 2A, the time increment value increments upward and then resets when an output pulse is generated. In accordance with the present invention, the timing circuit 218 from time to time provides the time increment value to the output 222 to allow the receiving circuit to obtain a precision time stamp of an event. Further detail regarding the generation of the time increment value is provided below in connection with FIG. 3.

The timing circuit 218 also receives the power line timing information from one of the delay circuits 208, 210, or 212 through the selector switch 220. During normal operation, i.e., the precision time information signal is available, the timing circuit 218 does not utilize the power line timing information.

In the event of an interruption in receiving the precision time information, however, the timing circuit 218 generates the output pulse synchronized to the power line timing information. Specifically, the timing circuit 218 generates the output pulse based on and synchronized to the power line timing information received from the selector switch 220. If the power line timing information becomes unavailable because the corresponding phase power line loses power, then the selector switch 220 obtains power line timing information from another of the delay circuits 208, 210 and 212.

Thus, the timing circuit 218 of the exemplary embodiment described herein includes four redundant sources of fairly precise time synchronization information. It will be appreciated that more or less sources of power line timing information may be included. For example, in a single phase power system, only one power line timing information source would be available. In another alternative, a three phase meter may further include an auxiliary AC power source. In such a case, the auxiliary AC power source could constitute an additional power line timing information source.

In the preferred embodiment, the timing circuit 218 is also operable to continue to generate output pulses based on the clocking information in the event that neither the precision timing information nor any of the power line timing information signals are available. However, because the clocking signal is not synchronized to an external source, it will generally become increasingly inaccurate over long durations of time.

FIG. 3 shows in further detail an exemplary embodiment of a portion of the timing arrangement 200 that includes the first power line timing information input 202, the delay circuit 208, the precision timing information input 214, the clocking signal input 216, the selector switch 220, and the timing circuit 218.

The first power line timing information input 202 in the embodiment of FIG. 3 constitutes an edge detect filter that is operable to generate a line frequency pulse signal. To this end, the edge detector filter is operable to generate a pulse at each detected zero crossing of the input digital measurement power signal. As a result, the first power line timing information input 202 in the present embodiment generates a 60 Hz pulse signal in a 60 Hz frequency power system. The edge detect filter also includes a digital low pass filter that prevents instantaneous voltage spikes from causing erroneous generation of the pulses. The first power line timing information input 202 is operably connected to provide the line frequency pulse signal to the delay 208.

The delay 208 comprises a sample delay buffer 230, a phase detect 232, a filter 234, a saturation protector 236, and a scaling block 238. The sample delay buffer 230 is operable to generate introduce a delay into the line frequency pulse signal. The amount of delay is controlled by a delay value received at its control input 230a. In particular, the sample delay buffer 230 provides a delay of x clock cycles into the line frequency pulses, where x is the delay value received at the control input 230a. In the exemplary embodiment described herein, the clock cycles occur at a frequency 2721 Hz, which translates to a granularity of about 45 delay increments between adjacent pulse signals in a 60 Hz system. The delay buffer 230 is preferably operable to provide a delay in excess of two line cycles. Such storage capability allows for fairly large swings in the delay amount. The control input 230a is coupled to receive the delay value from a phase adjustment circuit that comprises the phase detect 232, the filter 234, the saturation protector 236, and the scaling block 238 as described below.

In particular, the phase detect 232 is operable to generate a phase offset value that is representative of the phase difference between line frequency pulse signal and the output pulse signal (clock information) generated by the timing circuit 218. To this end, the phase detect 232 is operably coupled to receive the line frequency pulse signal from the delay buffer 230, and is further operably coupled to receive a value that is representative of the phase of the output pulse signal from the multiplier 242, which is discussed in further detail below.

The phase offset value constitutes the value received from the multiplier 242 at the time each pulse of the line frequency pulse signal occurs. The phase offset value thus constitutes an error signal that is representative of the phase difference between the synchronized output of the timing circuit 218 and the delayed line frequency pulse signal. Accordingly, under ideal or stable conditions, the phase offset value is very small or zero. The phase detect 232 is operably connected to provide the phase offset value to the filter 234.

The filter 234 is a digital filter that reduces or dampens the effect of large phase offset values. For example, the filter 234 may suitably employ the following equation $$\text{FILTER\_OUT}(n) = \text{FILTER\_OUT}(n-1) + \text{PHASE\_OFFSET}(n)/\text{CONST} \quad (1)$$

wherein FILTER_OUT(n) is the filter output signal, PHASE_OFFSET(n) is the phase offset value, and CONST is filter damping constant. Where the phase offset value is expressed as a sixteen bit signed number and the clock frequency is equal to 2721 Hz, the value of CONST may suitably be 128. The filter 234 provides the resulting filtered phase offset, which constitutes the raw delay value, to the saturation protector 236.

The filter 234 also includes a reset input 234a that is coupled to receive the precision time information from the precision timing information source 214. The filter 234 resets FILTER_OUT(n−1) to zero whenever the precision time information pulse is received. The filter 234 provides the filter output signal to the saturation protector 236.

The saturation protector 236 is a functional block that receives the raw delay value from the filter 234 and determines whether the raw delay value has exceeded the maximum value that can be handled by the digital circuitry of the elements in FIG. 3. For example, the embodiment of FIGS. 2 and 3 employs a sixteen bit signed number system. As a result, the maximum system number is +32767. If the saturation protector 236 determines that the raw delay value has overflowed, or in other words, turned over from +32767 to −32768, then the saturation protector 236 produces an output value of +32767. Thus, the saturation protector 236 prevents large erroneous swings in the raw delay value due to a mathematical overflow. If no overflow is detected, then the saturation protector 236 merely passes through the raw delay value. It will be appreciated that if the digital circuitry can accommodate much large number of bits than possible values for the filter output signal, then the saturation protector 236 would not be necessary.

The saturation protector 236 provides the raw delay value to the scaling block 238. The scaling block 238 is operable to convert the raw delay value into the delay value. In other words, the scaling block 238 merely converts the raw delay value to the corresponding delay value expressed in terms of the clocking signal frequency. In the particular embodiment described herein, the scaling block 238 divides output value by 512, which is a function of the use of the sixteen bit signed number as the raw delay value, and is also a function of the size of the delay buffer, which is 128 bits. In addition, the scaling block adds 64 to the result in order to bias the final delay value toward the center of the delay buffer 230.

The above circuit thus operates to generate a delayed line frequency pulse signal that is synchronized to be in phase with the output pulse signal of the timing circuit 218. As will be discussed below, the phase of the output pulse signal is aligned with the precision time information. As a result, the above circuit serves to generate a line frequency pulse signal that is substantially synchronized to the precision time information under normal operating conditions.

Referring now to the timing circuit 218, the timing circuit 218 includes a constant block 240, a multiplier block 242, an accumulator 244, a loop filter 246, and a phase detector 248.

In general, the accumulator 244 is a device that generates the clock information at the output 222 of the timing circuit 218. To this end, the accumulator 244 includes a pulse output 244a and a value output 244b. The accumulator 244 further includes value inputs 244c and 244d, a clocking input 244e, and a reset input 244f.

The pulse output 244a is an output that provides the pulse output signal portion of the clock information generated by the arrangement 200 of FIG. 2. Accordingly, the pulse output 244a is configured to be connected to the device that maintains the real-time calendar/clock of the meter. In the present embodiment, the pulse output signal comprises a 1 Hz pulse signal.

The value output 244b is an output that provides the time increment value portion of the clock information generated by the arrangement 200 of FIG. 2. The time increment value is stored in the form of a current count value within the accumulator 244. The current count value is representative of the fraction of the time that has elapsed since the previous output pulse generated at the pulse output 244a. In the exemplary embodiment herein, the current count value is a 32 bit value. Because the exemplary embodiment described herein operates with 16 bit numbers, the accumulator 244 in the present embodiment includes two stored values to maintain the current count value.

The value output 244b is configured to be connected to circuitry generates precision time stamp information. That circuitry would use the calendar/clock information and the time increment value to pinpoint the timing of an event, such as a power quality event, to a high degree of precision. In the exemplary embodiment described herein, the time increment value is the most significant 16 bits of the current count value. It will be noted, however, that in alternative embodiments, the accumulator 244 may maintain a current count value that is the same number of bits as supported by the system. In such a case, the current count value and the time increment value may be identical.

The value output 244b is further coupled to the phase detect 232 through the multiplier 242. In general, because the time increment value represents the time increment that has passed since the last pulse, the time increment value represents the phase of the output pulse signal generated by the timing circuit 218. Thus, the time increment value, multiplied by the multiplier 242, constitutes the phase information that is employed by the phase detect 232 as described above to synchronize the line frequency pulse signal to the output pulse signal generated by the timing circuit 218.

The value output 244b is also coupled to the phase detect 248 through the multiplier 242. The phase detect 248 also uses the multiplied time increment value as phase information for the purposes of aligning the output pulse signal of the timing circuit 218 to the line frequency pulse signal, as discussed further below.

The multiplier 242 is a device that is operable to multiply the time increment value to convert the phase information of the current count value to the line frequency of the power line timing information. Accordingly, in the exemplary embodiment described herein, wherein the line frequency is 60 Hz and the output pulse signal frequency is 1 Hz, the multiplier 242 is operable to multiply the current count value by 60.

Referring again to the accumulator, the value inputs 244c and 244d represent the numerical value inputs that are added to the current count value during each clock cycle. For example, if the current count value is 34, and the values at the inputs 244c and 244d are, respectively, 2 and 5, then after the next clock cycle, the current count value becomes 34+2+5 or 41. If the values at the inputs 244c and 244d do not change, then after the next clock cycle, the current count value becomes 48, and so forth.

The value inputs 244c and 244d define the rate at which the accumulator 244 acquires increments of time between output pulses. The value input 244c is operably connected to receive the constant value 240, and the value input 244d is operably coupled to receive the phase adjustment value from the loop filter 246, discussed below.

The reset input 244e is an input that resets the current count value in the accumulator 244 to zero, or at least some other base line value. The reset input 244e is coupled to the precision timing information input 214.

The clocking signal input 244f is operable to receive the clocking signal, which in the exemplary embodiment described herein is a 2721 Hz pulse signal.

In general, the accumulator 244 operates in the following manner. Upon receipt of each clocking signal pulse at the clocking signal input 244f, the accumulator 244 adds to the current count value those values that are present on the inputs 244c and 244d. If the current count value reaches an overflow value, then the accumulator 244 generates a pulse output at the pulse output 244a.

To this end, the constant value 240, which is coupled to the value input 244c, is chosen such that one second's worth of clock cycles will reach the overflow value. In other words, if the constant value 240 is chosen correctly and the clocking signal is ideal, then the accumulator 244 will always overflow after exactly one second passes. Accordingly, the constant value 240 may be determined by dividing the clocking signal frequency into the overflow value of the accumulator 244. Because the actual frequency of the clocking signal may vary from meter to meter based on the tolerance of the clocking circuit, the constant value 240 should be determined when the clocking circuit of the meter is calibrated.

In any event, because the accumulator 244 generates an output pulse when the current count value reaches the overflow, it can be seen that increasing the values at the value inputs 244c and 244d can "speed up" the timing circuit 218, and decreasing the values at the value inputs 244c and 244d can "slow down" the timing circuit 218.

In order to employ the precision time information received at the reset input 244e, the accumulator 244 is also operable to generate an output pulse at the pulse output 244a when 1) a reset signal has been received at the reset input 244e and 2) the current count value is within relatively close range of the maximum (i.e. overflow) value. These operations of the accumulator 244 allow the precision time signal control to override and/or adjust the current count value if the accumulator 244 is not tracking time accurately.

In particular, if the accumulator 244 is running "slow", then the precision time signal will be received at the reset input 244e before the current count value has reached the overflow value. In such a case, the accumulator 244 would generate an output pulse because the precision time signal has been received and the current count value, which is almost but not quite at the overflow value, is sufficiently within close range to the overflow value. The precision time signal also resets the current count value to align the current count value with the precision time signal.

By contrast, if the accumulator 244 is running "fast", then the current count value will reach the overflow value and cause the generation of the output pulse before the precision time signal is received at the reset input 244e. Thereafter, when the precision time signal is received, the current count value will be relatively low, and thus significantly out of close range of the overflow value. Accordingly, even though the precision time signal is received at the reset input 244e, the accumulator 244 does not generate another output pulse. Nevertheless, the precision time signal still resets the current count value, thereby aligning the current count value with the precision time signal.

The above operations of the accumulator 244 occur when the precision time signal is available. From time to time, however, the precision time signal may not be available. In such cases, the inaccuracies of the clocking circuit within the meter could cause timing inaccuracies that cannot be recovered when the precision time signal returns.

In accordance with the present invention, however, the timing arrangement 200 synchronizes the clock information generated by the timing circuit 218 with power line timing information to maintain the accuracy of the clock information when the precision timing information is not available. To this end, the phase detect 248 and the loop filter 246 represent a phase-locked loop that synchronizes the timing circuit 218 to the line frequency pulse signal in the event that the precision timing information becomes unavailable. In general, the phase locked loop adjusts the rate at which the accumulator 244 increments the current count value based on the power line timing information.

To this end, the phase detect 248 is coupled to receive the phase information pertaining to output pulse signal of the timing circuit 218 from the multiplier 242. The phase detect 248 is also coupled to receive the (delayed/synchronized) line frequency pulse signal from the delay buffer 230. The phase detect 248 is operable to generate a phase adjust value at its output. The phase adjust value is the numerical value from the multiplier 242 at the time that each pulse of the line frequency pulse signal is received. The phase adjust value is representative of the phase difference between the output pulse signal generated by the timing circuit 218 and the line frequency pulse signal received from the delay buffer 230.

The phase detect 248 is operably couple to provide the phase adjust value to the loop filter 246. The loop filter 246 effectively dampens the phase adjust value to produce the accumulator adjustment value. The loop filter 246 provides the accumulator adjustment value to the value input 244d of the accumulator 244.

In the exemplary embodiment described herein, the accumulator adjustment value, a sixteen bit number, is added to the least significant sixteen bits of the current count value. Moreover, the loop filter 246 may suitably carry out the following operation:

$$\mathrm{ADJ}(n) = \mathrm{ADJ}(n-1) + \mathrm{ERROR}(n-1) - \mathrm{ERROR}(n)/\mathrm{CONST} \qquad (2)$$

wherein ADJ(n) is the accumulator adjustment value, ERROR(n) is the phase adjust value, and CONST is a relatively large damping value, for example, 256.

The loop filter 246 also includes a reset input 246a that is connected to the precision time information through a hold circuit 250. In general, the hold circuit 250 and the reset input 246a operate to disconnect the phase-locked loop operation when the precision time information is available. To this end, the hold circuit 250 is operable to hold the precision time information pulse for the normal period between adjacent precision time information pulses. Thus, when the precision time information is present, the hold circuit generates a continuous pulse signal that is provided to the loop filter reset input 246a. As a result, when the precision time information is present, the loop filter 246 is constantly in a state of reset, thereby effectively disconnecting the phase-locked loop from the accumulator 244.

In the event that the precision time information becomes unavailable, the hold circuit 250 stops holding the most recent pulse after pulse period. As a result, the hold circuit 250 no longer provides a continuous pulse to the reset input 246a. Because the reset signal is absent, the loop filter 246 and the phase detect 248 begin operating to synchronize the accumulator 244 with the line frequency pulse signal. As discussed above in connection with the operation of the delay 230, the line frequency pulse signal had been synchronized to the precision time information when it was available. As a result, the transition between the control of the accumulator 244 by the precision time signal and the control of the accumulator 244 by the line frequency pulse signal should be relatively seamless.

In any event, because the accumulator adjustment value generated by the loop filter 246 is provided to the value input 244d, the accumulator adjustment value may be used to "speed up" the accumulator 244 by adding a positive value at the value input 244d and to "slow down" the accumulator 244 by adding a negative value at the value input 244d.

Thus, the above circuit has two basic modes of operation. The first mode is employed when the precision time information is available. The second mode is employed when the precision time information is unavailable.

In the first mode, the timing arrangement 200 employs the precision time signal at the reset input 244e of the accumulator 244 to synchronize the clock information of the timing circuit 218 to the precision time information. In addition, the delay circuit 208 synchronizes the power line timing information to the precision time information.

In the second mode, the timing arrangement 200 employs the power line timing information at the count input 244d to adjust the rate at which the accumulator 244 increments the current count value toward the overflow value.

It will be appreciated that the above described embodiments are merely exemplary, and that those of ordinary skill in the art may readily devise their own implementations that incorporate the features of the present invention and fall within the spirit and scope thereof.

We claim:

1. An apparatus for generating precision clock information, comprising:
    a source of power line timing information;
    a source of externally-generated precision time information;
    a timing circuit coupled to the source of externally-generated precision time information to receive a precision time signal therefrom, the timing circuit operable to generate clock information based on the precision time signal, the timing circuit further operable to generate clock information based on the power line timing information, the timing circuit comprising an accumulator, the accumulator including an output, a first input, a second input, and a third input;
    a source of clocking signals operable to generate a clocking signal having a frequency exceeding a frequency of the precision time signal, and wherein the timing circuit is further operable to generate the clock information based on the clocking signal; and,
    wherein the accumulator increments a value stored therein based on the second input and the third input;
    the accumulator is operable to receive a precision time pulse at the first input;
    the accumulator is operable to generate a timing output signal at the output when the value exceeds a predetermined threshold; and
    the accumulator is operable to generate a timing output signal at the output when the accumulator receives the precision time pulse.

2. An electricity meter operable to obtain data related to energy consumption, the meter comprising;
    a sensor circuit operable to generate voltage and current measurement signals;
    a measurement circuit operable to generate energy consumption data from the voltage and current measurement signals;
    a source of power line timing information;
    a source of externally-generated precision time information;
    a timing circuit coupled to the source of externally-generated precision time information to receive a precision time signal therefrom, the timing circuit operable to generate clock information based on the precision time signal, the timing circuit further operable to generate clock information based on the power line timing information;
    a memory operable to store at least some energy consumption data and a time record associated therewith, the time record generated in part using the clock information.

3. The apparatus of claim 2 wherein the timing circuit is operable to generate clock information based on the precision time signal when the power line timing information is unavailable and when the precision time signal is available.

4. The apparatus of claim 3 wherein the timing circuit is operable to generate clock information based on the power line timing information when the precision time signal is unavailable and when the power line timing information is available.

5. The apparatus of claim 3 wherein the power line timing information includes a pulse signal derived from a power line signal.

6. The apparatus of claim 5 further comprising a delay coupled between the source of power line timing information and the timing circuit, the delay operable to synchronize the pulse signal with the precision time signal.

7. The apparatus of claim 6 further comprising a source of clocking signals operable to generate a clocking signal having a frequency exceeding a frequency of the precision time signal, and wherein the timing circuit is further operable to generate the clock information based on the clocking signal.

8. The apparatus of claim 5 further comprising a source of clocking signals operable to generate a clocking signal having a frequency exceeding a frequency of the precision time signal, and wherein the timing circuit is further operable to generate the clock information based on the clocking signal.

9. The apparatus of claim 3 further comprising a source of clocking signals operable to generate a clocking signal having a frequency exceeding a frequency of the precision time signal, and wherein the timing circuit is further operable to generate the clock information based on the clocking signal.

10. The apparatus of claim 2 wherein the timing circuit is operable to generate clock information based on the power line timing information when the precision time signal is unavailable.

11. The apparatus of claim 10 wherein the power line timing information includes a pulse signal derived from a power line signal.

12. The apparatus of claim 11 further comprising a delay coupled between the source of power line timing information and the timing circuit, the delay operable to synchronize the pulse signal with the precision time signal.

13. The apparatus of claim 10 further comprising a source of clocking signals operable to generate a clocking signal having a frequency exceeding a frequency of the precision time signal, and wherein the timing circuit is further operable to generate the clock information based on the clocking signal.

14. The apparatus of claim 11 further comprising a source of clocking signals operable to generate a clocking signal having a frequency exceeding a frequency of the precision time signal, and wherein the timing circuit is further operable to generate the clock information based on the clocking signal.

15. The apparatus of claim 14 further comprising a delay coupled between the source of power line timing information and the timing circuit, the delay operable to synchronize the pulse signal with the precision time signal.

16. The apparatus of claim 2 wherein the power line timing information includes a pulse signal derived from a power line signal.

17. The apparatus of claim 16 further comprising a delay coupled between the source of power line timing information and the timing circuit, the delay operable to synchronize the pulse signal with the precision time signal.

18. The apparatus of claim 2 further comprising a source of clocking signals operable to generate a clocking signal having a frequency exceeding a frequency of the precision time signal, and wherein the timing circuit is further operable to generate the clock information based on the clocking signal.

19. The apparatus of claim 18 wherein the power line timing information includes a pulse signal derived from a power line signal.

20. The apparatus of claim 19 further comprising a delay coupled between the source of power line timing information and the timing circuit, the delay operable to synchronize the pulse signal with the precision time signal.

* * * * *